(12) United States Patent
Christensen et al.

(10) Patent No.: US 6,173,843 B1
(45) Date of Patent: Jan. 16, 2001

(54) COMPUTER EXPANSION CARD LATCHING AND RETENTION MECHANISM

(75) Inventors: David M Christensen, Mission Viejo; Arthur L. Smith, Huntington Beach, both of CA (US)

(73) Assignee: Gateway, Inc, North Sioux City, SD (US)

( * ) Notice: Under 35 U.S.C. 154(b), the term of this patent shall be extended for 0 days.

(21) Appl. No.: 09/440,487

(22) Filed: Nov. 15, 1999

(51) Int. Cl.$^7$ ........................................... A47F 5/00
(52) U.S. Cl. .................. 211/41.17; 361/759; 361/801
(58) Field of Search ..................... 211/26, 41.17; 361/740, 759, 801, 683

(56) References Cited

U.S. PATENT DOCUMENTS

| | | | |
|---|---|---|---|
| 5,398,162 | * | 3/1995 | Bice .................................. 361/740 X |
| 5,594,627 | | 1/1997 | Le ........................................ 361/801 |
| 5,601,349 | * | 2/1997 | Holt ................................. 361/801 X |
| 5,914,854 | | 6/1999 | Holt et al. ............................ 361/683 |
| 6,069,796 | * | 5/2000 | Hastings ........................ 211/41.17 X |

* cited by examiner

Primary Examiner—Robert W. Gibson, Jr.
(74) Attorney, Agent, or Firm—Laurence R. Letson

(57) ABSTRACT

A spring-biased latching mechanism eliminates the use of brackets and screws to retain expansion cards or electronic circuit boards in computers or similar information handling systems. The spring-biased latching mechanism has a latching member that is cammed out of the path of a computer expansion card as the card is inserted into the computer housing; the latching or retention member may be pushed to a fully retracted or withdrawn position and latched, thus removing the latching member from interference with the expansion card and permitting easy removal of the expansion card. The spring-biased latching member is provided with a groove to provide guidance to the expansion card during insertion and may stabilize the card whenever the latching member is extended to retain the expansion card in position relative to a computer motherboard. Elimination of the screws and brackets prevents any potential damage to the electronics of the computer resultant from dropped screws or bracket contact and any subsequent damage to electronic circuit boards in the computer. The spring-biased latching mechanism also greatly improves the speed of assembly and/or disassembly.

23 Claims, 3 Drawing Sheets

COMPUTER EXPANSION CARD LATCHING AND RETENTION MECHANISM

FIELD OF THE INVENTION

This invention relates to computers including personal computers, network servers and other types of computers that use expansion cards and, more specifically, to an improved mechanism that permits a simpler and more efficient insertion and removal of such expansion cards.

BACKGROUND OF THE INVENTION

Personal computers, network servers, and other similar types of computers use expansion cards to enhance or expand the functions that a computer can perform. This permits a computer to be sold in a basic performance configuration, minimizing the initial cost of purchase and, therefore, permitting the computer to be flexibly adapted to a user's particular needs. Expansion cards are electronic circuit cards that may be inserted into connectors on a motherboard or master system circuit card of a computer. The expansion card frequently has at least one connector, which is exposed through a panel of the computer housing, permitting the connection of an external cable to the expansion card for further attachment of peripheral devices to the computer. Peripheral devices can be printers, displays, speakers, scanners, telephone lines, networks or other devices or systems which are not required for the computer per se to operate in a basic mode of operation.

Heretofore, the insertion or removal of such expansion cards from the chassis or frame of the computer commonly required the removal of at least one screw. The screw retained an expansion card or an expansion slot cover. After removal or installation of the expansion card, the screws and/or retaining bracket must be re-installed.

The removal of screws to free retaining brackets or expansion slot covers is tedious and requires not only a tool but also presents the risk of either a screw or a retaining bracket being inadvertently dropped into the computer. Such an accident could potentially damage the electronic circuit boards of the computer, rendering the computer inoperable or repairable only at a significant expense along with the inconvenience of interrupted usage.

In view of these factors, especially the risk of damage, many owners of personal computers or network servers have been reluctant to insert, change, or remove expansion cards and have relied on others to do so, often at significant monetary expense and inconvenience.

Further, during final assembly of the computer, through inattention, it is possible that screws could be dropped in the computer. Function cards are similar to expansion cards but are typically installed in the computer by the manufacturer and are seldom removed. As the computer or server is initially powered, dropped screws could damage expensive electronic components of the computer.

Therefore, the invention will reduce not only the time and labor to assemble a plurality of pieces to hold expansion cards in their assembled positions, but will reduce the risk of damage to the computer electronics as well.

OBJECTS OF THE INVENTION

It is an object of the invention to simplify the installation and/or removal of electronic circuit expansion cards into and/or from a computer.

It is another object of the invention to eliminate the requirement for tools in order to insert or remove electronic circuit expansion cards into or from a computer.

It is a further object of the invention to eliminate the need for screws and other hardware that commonly must be manually removed to add or remove electronic circuit expansion cards from a computer.

It is a still further object of the invention to protect the electronic circuits of a computer by preventing damage which may result from use of brackets, screws and tools used in connection with insertion or removal of electronic circuit expansion cards of a computer.

It is still another object of the invention to eliminate fasteners and related hardware that must be removed and replaced whenever an electronic circuit expansion card either is removed from or inserted into a computer.

SUMMARY OF THE INVENTION

A system for retaining electronic expansion circuit cards or expansion circuit boards within a computer housing eases the insertion and/or removal of the expansion circuit cards while accomplishing the above-mentioned objects of the invention, and overcomes the shortcomings of the prior art.

A retaining system housing is either incorporated into or attached and mounted onto a panel of the computer housing, thereby providing a constraint or channel for the movement of a slidable spring-biased latch member which may be held in a retracted position within the housing. The housing guides the displacement of the slidable latch member as it is extended under the influence of a compression spring, biasing the slide latch member and the retention member housing away from each other. The slide latch member is held in a retracted position by a catch latch having a sear engageable with a latch surface on cantilevered latches. The retention of the slide latch may be released by dislocating the cantilevered catch latch to disengage the sear from the latch surface and permit the compression spring to extend the latch member from the retention mechanism housing.

The retractable latch member is formed with an inclined or sloping face which acts as a cam follower and is cammed out of interference with an electronic expansion circuit board as the expansion card is engaged with the slide latch and forcibly displaced into the computer housing.

The slide latch automatically extends after the electronic expansion circuit board is inserted past the slide latch. The extended slide latch retains and holds the electronic expansion circuit board in its intended location. A guiding groove or channel may be formed into the inclined face of the slide latch to guide the electronic expansion circuit card during insertion. A similar groove may be formed into the bottom or retaining surface to capture and constrain the electronic expansion circuit card against undesirable lateral movement of the electronic expansion circuit card once connected with the motherboard, the main electronic system circuit board of the computer.

A better and more complete understanding of the invention may be had from the attached drawings and from the Detailed Description of the Invention that follows.

DETAILED DESCRIPTION OF PREFERRED EMBODIMENTS OF THE PRESENT INVENTION

In the various embodiments of the disclosed invention, the retention member or element of the system is common, although the housing of the system may either be formed integrally with the housing or wall of the computer housing, or be attached to a separate wall of the computer housing.

Even though the description of the retention system is made in the context of a computer, such as a personal computer, the invention is nevertheless equally applicable to network servers and other types of computers or systems that utilize electronic expansion cards or electronic expansion circuit boards to expand or enhance functions or capabilities of the computer or server. The term computer is used in a broad generic sense, inclusive of information handling systems, personal computers, network servers and other devices using electronic expansion cards or electronic expansion circuit boards. The term expansion cards and electronic expansion circuit boards refer to the same device and are used interchangeably within this description.

Figure 1:
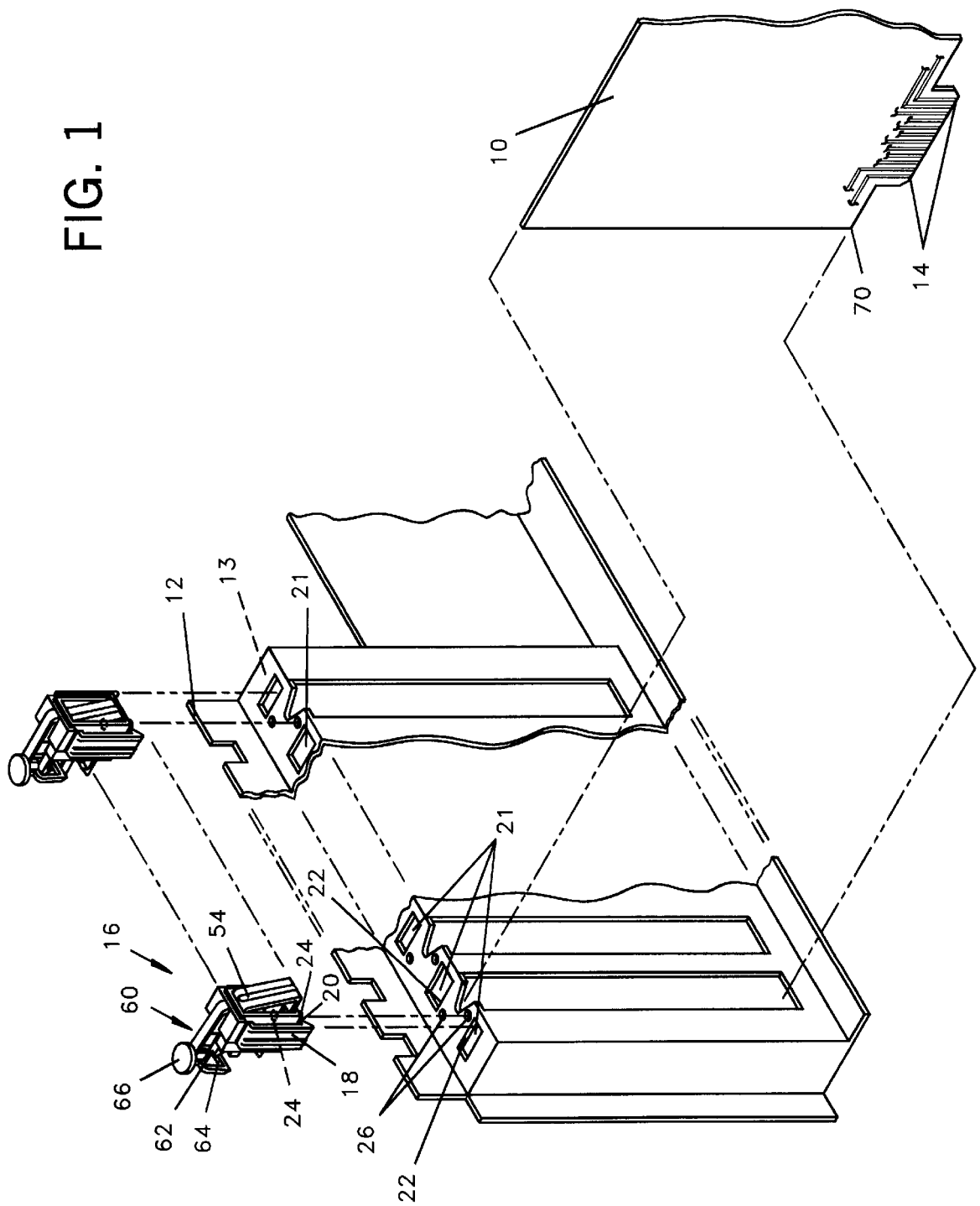
FIG. 1 is a partially exploded perspective illustration of the expansion card retention mechanism and an expansion card associated with the expansion card port panel of a computer housing.

Illustrated in FIG. 1, an expansion card 10 may be added to a computer to allow an additional printer connection, communications capabilities, sound output, network connections, modem connection or other enhanced capability. The expansion card 10 is inserted into the computer housing (not shown) comprising panel 12. Within the computer housing, there is typically a motherboard or electronic system circuit board (not shown) having a plurality of expansion connectors or slots (not shown) to which an expansion card 10 is connected.

To simplify the insertion and removal of expansion cards 10 without removing screws and brackets, an improved insertion guiding and retaining mechanism is desirable. In order to insure that the expansion card 10 is reliably connected and maintained in a connected condition with the motherboard (not shown) through connection contacts 14 being engaged with the expansion slots or expansion connectors of the motherboard, it is necessary to prevent any movement of the expansion card 10 away from the motherboard once the expansion card 10 is connected. Latching and retention of the expansion card 10 is accomplished by a retention mechanism 16 which also simplifies the insertion into and/or removal of the expansion card 10 from the computer housing.

Referring again to FIG. 1, wherein the retention mechanism 16 is shown as a separate mechanism from panel 12 and is exploded away from the panel 12, the retention mechanism 16 is attachable to panel 12 by engaging latch members 18 and, particularly, latch sear 22 with latch surface 20. The latch member 18 extends through the panel 12 and sear 22 engages latch surface 20 on the exterior side 13 of panel 12. Engagement of latches 18 with panel 12 holds retention mechanism 16 onto panel 12.

Retention mechanism 16 may be further stabilized relative to panel 12 by the engagement of stabilizing projections 24 (as better shown in FIG. 2) into alignment holes 26 of panel 12.

Figure 2:
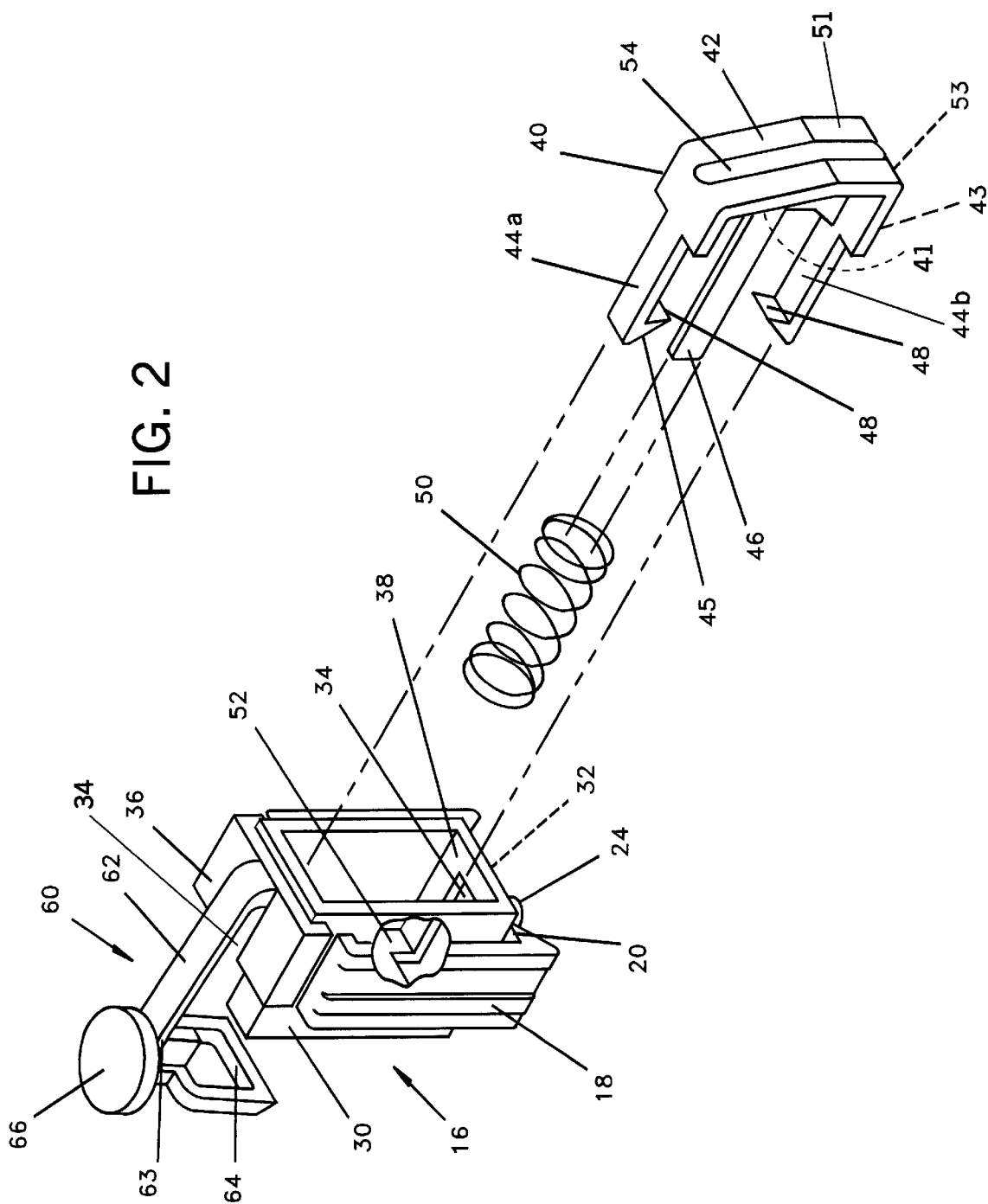
FIG. 2 is an exploded perspective view of the expansion card retention mechanism.

Referring now to FIG. 2 in conjunction with FIG. 1, the retention mechanism 16 is shown in exploded form. The retention mechanism 16 comprises a housing 30. Latches 18 are supported, one on each side (opposite side not shown), by housing 30. Latches 18 are cantilevered from housing 30 with a latch surface 20 formed into the end of each latch 18. Latch surfaces 20 are disposed on latches 18 and are to be extended through openings 21 (as shown in FIG. 1) and beyond bottom surface 32 of housing 30 by sufficient distance to accommodate the thickness of the metal plate from which panel 12 is fabricated, between the latch surfaces 20 and surface 32 of housing 30. The clearance between latch surface 20 and sear 22 allows latches 18 to spring back to a relaxed state, such that latch surface 20 is juxtaposed with panel 12, thereby trapping housing 30 on panel 12.

Slide latch 40 further comprises a sloped or inclined surface 42 that acts as a cam follower. The slide latch 40 is cammed out of interference with an electronic expansion card 10 whenever electronic circuit board 10 is inserted into the computer. Housing 30 is further provided with relief channels 34 in its top wall 36 and bottom wall 38. Relief channels 34 provide pathways through which a pair of cantilevered latch arms, upper and lower latch arm 44a and 44b respectively, of slide latch 40 extend to permit assembly of slide latch 40 into housing 30.

Cantilevered latch arms 44a and 44b extend through channels 34, and the retaining latch surfaces 48 of latch arms 44a and 44b engage the outside surface of rear wall 52 of housing 30 to retain retaining mechanism 16 in an assembled condition.

Slide latch 40 is biased outwardly from housing 30 by compression spring 50 which engages the exterior surface of rear wall surface 52 of housing 30 and slide latch 40. The compression spring 50 is stabilized against buckling by placing spring 50 surrounding the stabilizer shaft 46. Additionally, stabilizer shaft 46 is formed to extend from the backside 41 of slide latch 40 and through an opening (not shown) in housing 30. Stabilizer shaft 46 also guides and stabilizes slide latch 40 to help prevent binding. The stabilizer shaft 46 may be round, rectangular or any other desired cross-sectional shape.

Housing 30 further incorporates catch latch 60. Catch latch 60 comprises cantilevered deflectable beam 62 extending from housing 30. At a distal end 63 of deflectable beam 62 and depending therefrom is sear 64, engageable and disengageable from latch surface 48. Sear 64, biased by the deflectable beam 62 to engage latch surface 48, holds slide latch 40 in a retracted position. Release of slide latch 40 is accomplished by manual depression of button 66 on deflectable beam 62, forcing sear 64 downward, and disengaging sear 64 from latch surface 48, allowing restoration via the compression spring 50.

With respect to FIGS. 1 and 2, and with the retaining mechanism 16 assembled, an electronic expansion board or electronic circuit card 10 may be installed in a computer by engaging an end 70 of electronic expansion board 10 with the slide latch 40 and pushing the electronic circuit board 10 downwardly, thereby camming the slide latch 40 out of the path of electronic expansion card 10. As the slide latch 40 is cammed or forced to a compressed or retracted position, and as it subsequently clears the top edges of electronic expansion board 10, the electronic expansion board 10 will be latched in position by slide latch 40. Slide latch 40 restores from a spring-bias provided by compression spring 50, causing slide latch 40 to extend outwardly from housing 30 and thus be positioned above and in a position interfering with any movement of electronic expansion board 10 in the opposite direction to insertion movement. The slide latch 40 is not displaced far enough into housing 30 during electronic expansion card insertion to engage sear 64 with latch surface 48 of upper latch arm 44a, thereby preventing the slide latch 40 from locking in a retracted position.

Groove 54, formed into the surface 42 of slide latch 40, acts as a guide to resist lateral movement of electronic expansion board 10 during insertion. If no other guide or lateral constraint is provided for the circuit board 10, a similar groove 53 may be incorporated into a retaining surface 43 of slide latch 40. The groove 53 in retaining latch surface 43 traps or constrains the top edge of the electronic expansion board 10 and stabilizes the electronic expansion board 10 against unwanted or undesirable lateral movement.

Slide latch 40 may be formed with a relatively sharp projecting end at which surfaces 42 and 43 join, as shown in FIG. 1, or the projecting end may be blunted to provide a relatively flat vertical surface 51 as shown in FIG. 2. The blunted end surface 51 provides for a shortened slide latch 40 and permits a more compact design.

To remove an electronic circuit board 10 from a computer having circuit board retaining mechanism 16, slide latch 40 is manually forced to a fully retracted position into housing 30 such that the retaining latch surface 48 extends past sear 64, with cam surface 45 of upper latch arm 44*a* camming sear 64 out of the path of the movement of upper latch arm 44*a* and spring-loading the deflectable beam 62. In a fully retracted position, sear 64 is biased by deflectable beam 62 into interfering engagement with latch surface 48 on cantilevered upper latch arm 44*a*. Whenever latch surface 48 is engaged with sear 64, the slide latch 40 is held in a retracted position permitting circuit board 10 to be disconnected and removed from the motherboard (not shown) and the computer (not shown).

Slide latch 40 is released by manually depressing release button 66 on deflectable beam 62, forcing sear 64 downward, disengaging sear 64 from latch surface 48. Disengagement of sear 64 from latch surface 48 permits the compression spring 50 to decompress, extending slide latch 40 until latch surfaces 48 of upper and lower latch arms 44*a* and 44*b* engage the exterior surface of rear wall 52 of housing 30 (or housing 112 as shown in FIG. 3).

Figure 3:
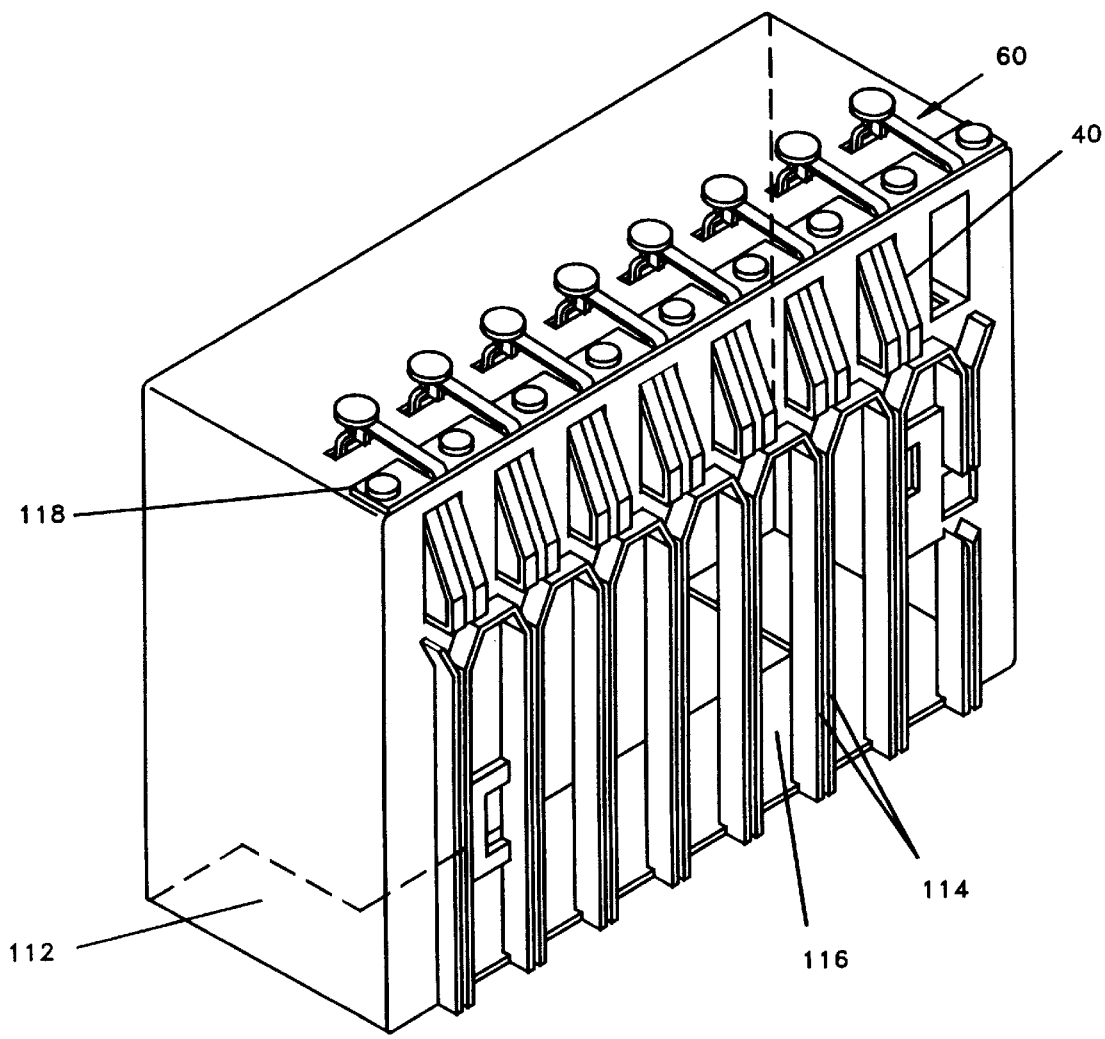
FIG. 3 is an illustration of the expansion card retention mechanism integrally formed as a part of an expansion card port panel of a computer housing.

Referring now to FIG. 3, an integrally formed expansion port panel or housing 112 is shown. Housing 112 incorporates electronic expansion board guides 114 and openings 116 intermediate guides 114 to expose connectors (not shown) on the electronic expansion boards 10.

The housing 112, typically a molded plastic structure, supports a plurality of catch latches 60 having a common support runner 118. The common support runner 118 may be attached to housing 112 with any suitable fastener, may attached with an adhesive or glue, or may be ultrasonically bonded to the housing 112.

The slide latch 40 is the same structure as the slide latch 40, illustrated in FIGS. 1 and 2, and interacts with the catch latch 60 in the same manner as previously described.

By incorporating retention mechanism 16 into a computer housing, the need for tools to remove retaining brackets, screws and related hardware in the installation of electronic expansion circuit boards 10 is eliminated along with any possibility of losing such screws or other items inside the computer which could result in short circuits or other damage to the computer electronic circuits. Speed of assembly and/or disassembly is greatly enhanced and simplified over the prior art approach to retention of the electronic circuit boards in the computer.

Should full length expansion cards 10 extend completely across a computer housing, it may be advantageous to use a retention mechanism 16 of this invention to retain and latch both ends of the expansion card 10.

One of skill in the art will understand that minor changes and modifications may be made in the design of the retention system without altering the system to an extent that would remove the invention from the scope of protection afforded by the attached claims. One should further understand that this invention is applicable to personal computers and network servers as well as other information handling systems that utilize expansion circuit cards. Accordingly, the utility of this invention is of a wide scope and should not be limited to only personal computers or network servers.

What is claimed is:

1. A retaining apparatus comprising:

an apparatus housing, said retaining apparatus capable of being inserted into a computer housing for receiving and retaining an expansion card;

a slidably displaceable member in physical communication with said apparatus housing having an outward bias from said apparatus housing;

a biasing spring disposed intermediate said apparatus housing and said slidably displaceable member;

said slidably displaceable member comprising a surface and being capable of being slidably displaced into said apparatus housing by exertion of a force against said surface by insertion of the expansion card into the computer housing;

said slidably displaceable member being capable of returning to an outward bias position relative to said apparatus housing once the expansion card is properly inserted into the computer housing, thereby securing the expansion card in the computer housing; and said slidably displaceable member being capable of being locked into an inward position relative to said apparatus housing to enable easy removal of the expansion card by avoiding interference with such removal.

2. The retaining apparatus of claim 1 wherein said slidably displaceable member is releaseably latchable in the inward position.

3. The retaining apparatus of claim 2 wherein said slidably displaceable member is stabilized relative to said apparatus housing.

4. The retaining apparatus of claim 3 wherein said biasing spring is stabilized to prevent collapse.

5. The retaining apparatus of claim 4 wherein said biasing spring is stabilized by a stabilizing portion of said slidably displaceable member.

6. The retaining apparatus of claim 2 wherein said apparatus housing further provides a latching member, said latching member being operable to latch said slidably displaceable member in the inward position.

7. The retaining apparatus of claim 6 wherein said latching member is displaceable relative to said slidably displaceable member to unlatch said slidably displaceable member thereby permitting extension thereof from said apparatus housing.

8. The retaining apparatus of claim 1 wherein said apparatus housing is latchably retainable in the computer housing.

9. An article of manufacture comprising:

a housing;

a spring-biased latch within said housing capable of securing a properly inserted expansion card;

a second latch capable of retaining said spring-biased latch in a retracted position within said housing for enabling unobstructed removal of the expansion card; and a manually-operable release mechanism capable of disengaging said second latch to enable extension of said spring-biased latch outwardly of said housing in order to secure the expansion card in its properly inserted position.

10. The article of manufacture of claim 9 wherein said article of manufacture is latchably attachable to a computer housing.

11. The article of manufacture of claim 10 wherein said housing further comprises a latching mechanism for latchably attaching said article of manufacture to the computer housing.

12. The article of manufacture of claim 9 wherein said housing is formed as an integral part of a panel of the computer housing.

13. The article of manufacture of claim 9 wherein said spring-biased latch is retained in an assembled condition in said housing by said second latch.

14. The article of manufacture of claim 9 wherein said release mechanism comprises a manually deflectable third latching member engageable with said second latch.

15. The article of manufacture of claim 9 wherein said spring-biased latch further comprises a guiding surface for engagement by said expansion card.

16. The article of manufacture of claim 9 wherein said article of manufacture further comprises a surface for constraining said properly inserted expansion card against lateral movement.

17. A rapid assembly/disassembly device, for aiding in the assembly of an expansion card into a computer housing or disassembly of the expansion card from the computer housing, comprising:

a spring-biased latch;

a latch housing capable of allowing said spring-biased latch to retract and allow passage of the expansion card for assembly into the computer housing;

a second latch capable of engaging said spring-biased latch in a withdrawn position; and said second latch manually displaceable to release said spring-biased latch, thereby permitting extension of said spring-biased latch into a retaining position relative to the expansion card.

18. The rapid assembly/disassembly device of claim 17 wherein said second latch is deflectably mounted on a cantilevered beam.

19. The rapid assembly/disassembly device of claim 17 wherein said spring-biased latch is stabilized relative to said latch housing and capable of preventing possible binding of said spring-biased latch and said latch housing.

20. The rapid assembly/disassembly device of claim 19 wherein said spring-biased latch comprises a stabilizing shaft extendable through said latch housing.

21. The rapid assembly/disassembly device of claim 19 further comprising a spring resiliently engaged intermediate said latch housing and said spring-biased latch.

22. The rapid assembly/disassembly device of claim 21 wherein said spring is further stabilized by said stabilizer shaft.

23. The rapid assembly/disassembly device of claim 22 wherein said latch housing comprises a retaining latch capable of attaching said latch housing to a portion of said computer housing.

* * * * *